United States Patent [19]

Arnould

[11] 4,339,627

[45] Jul. 13, 1982

[54] PROCESS FOR COOLING A SOLAR CELL AND A COMBINED PHOTOVOLTAIC AND PHOTOTHERMIC SOLAR DEVICE

[75] Inventor: Jacques Arnould, Paris, France

[73] Assignee: Le Silicium Semiconducteur SSC, Paris, France

[21] Appl. No.: 229,263

[22] Filed: Jan. 28, 1981

[30] Foreign Application Priority Data

Feb. 1, 1980 [FR] France .................................. 80 02254

[51] Int. Cl.³ .......................... H01L 31/04; F24J 3/02
[52] U.S. Cl. ..................................... 136/259; 136/248; 126/432; 126/438
[58] Field of Search ............... 136/248, 259; 126/432, 126/438

[56] References Cited

U.S. PATENT DOCUMENTS

| | | | |
|---|---|---|---|
| 4,045,246 | 8/1977 | Mlausky et al. | 136/246 |
| 4,153,813 | 5/1979 | Blieden et al. | 136/247 |
| 4,171,003 | 10/1979 | Forrat | 136/247 |
| 4,210,121 | 7/1980 | Stark | 126/424 |
| 4,278,829 | 7/1981 | Powell | 136/248 |

OTHER PUBLICATIONS

T. I. Chappell et al, "Characteristics of a Water Absorber in Front of a Silicon Solar Cell", *Appl. Phys. Lett.*, vol. 28, pp. 422–423, (1976).

*Primary Examiner*—Aaron Weisstuch
*Attorney, Agent, or Firm*—Cushman, Darby & Cushman

[57] ABSTRACT

A solar cell cooling process. The device implementing this process comprises a transparent assembly disposed in front of a photovoltaic cell. The transparent assembly, through which flows the cooling fluid leaving a radiator integral with the cell, absorbs the wavelengths greater than 1.1. micron. Thus, heating of the cell is limited and the fluid leaving the radiator is heated by the beam striking the cell.

9 Claims, 2 Drawing Figures

PROCESS FOR COOLING A SOLAR CELL AND A COMBINED PHOTOVOLTAIC AND PHOTOTHERMIC SOLAR DEVICE

BACKGROUND OF THE INVENTION

The present invention relates to a process for cooling a solar cell and a combined photovoltaic and photothermic solar device.

We shall be concerned herein more particularly with photovoltaic devices intended to serve as a solar cell and operating with concentrated light. The efficiency of these devices is optimum when their temperature is low. Particularly, in the case of silicon cells, it is desirable for the temperature not to exceed a value of the order of 50° to 60° C. Thus, currently, solar cells are disposed on radiators, possibly radiators with fluid circulation. The fluid circulation must be provided so that the outlet temperature of the fluid does not exceed a value of the order of 50° to 60° C. A fluid at such a temperature cannot be easily used for heat applications.

Thus, an object of the present invention is to provide a process and a device improving the cooling of a photovoltaic device.

Another object of the present invention is to provide such a device for supplying heat energy at a temperature higher than the temperature directly compatible with a semiconductor cell of a given type.

SUMMARY OF THE INVENTION

To attain these objects and others, the present invention provides a process for cooling a photovoltaic cell integral with a fluid circulation radiator in which there is disposed, in front of the cell and in the path of the incident radiation, an assembly through which the cooling fluid passes and which absorbs at least a part of the incident radiation whose spectrum is outside the sensitivity zone of the cell. This assembly may comprise transparent windows between which the fluid flows, the materials forming the windows and the fluid being chosen so that at least a part of the absorbed radiation is directly absorbed by the fluid.

A combined concentrated-light photothermic and photovoltaic solar device in accordance with the present invention comprises a photovoltaic cell integral with a radiator in which flows a cooling fluid; an assembly disposed in the path of the incident beam; means for causing the fluid to flow in this assembly; this assembly absorbing, in cooperation with the fluid, at least a part of the incident radiation situated outside the spectral response band of the photovoltaic cell and transmitting the heat collected to the cooling fluid. The assembly in question comprises transparent windows, for example made from quartz, between which the cooling fluid, for example water, flows. The incident light may be focused on the cooling fluid and slightly defocused at the level of the photovoltaic cell. This cell may be of the vertical multijunction silicon cell type.

DESCRIPTION OF THE DRAWINGS

These objects, characteristics and advantages as well as others of the present invention will be set forth in more detail in the following description of particular embodiments with reference to the accompanying figures in which.

DESCRIPTION OF THE PREFERRED EMBODIMENT

Figure 1:
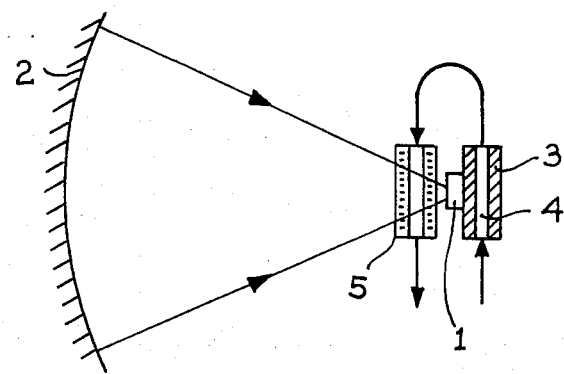
FIG. 1 shows a device in accordance with the present invention.

FIG. 1 shows schematically a photovoltaic cell 1 towards which there is transmitted a concentrated light beam coming from a reflector 2. This cell is thermally integral with a radiator 3 in which flows a fluid 4. This fluid 4 may be for example water. If the water flowing into radiator 3 is at a temperature substantially equal to 20° C., it is desirable, for the proper operation of the device and for increasing the efficiency of solar cell 1, for the output temperature to remain low, for example not greater than 50° or 60° C. This temperature does not allow the simple direct use of the heat energy collected.

Thus, in accordance with the present invention, an auxiliary assembly 5 is provided formed from two transparent windows between which flows the fluid 4 leaving radiator 3. The material forming the windows of cell 5 as well as fluid 4 are chosen to present special optical absorption qualities, i.e. that they absorb the greatest part of the incident spectrum outside the response spectrum of photovoltaic cell 1.

Thus there is obtained the double advantage of limiting the heating of cell 1 by avoiding irradiating it with radiations of wavelengths which do not produce any photovoltaic effect and of increasing the temperature of the fluid at the outlet of the device. Thus, if the fluid leaves radiator 3 at a temperature between 50° and 60° C., it will be able to leave assembly 5 at a temperature of the order of 70° to 80° C., which makes it more directly usable for different heat applications. In particular, the fluid may be water to which there may be possibly added a special agent for absorbing wavelengths greater than 1.1 micron. If it is not desired that assembly 5 absorb ultraviolet radiation, quartz windows may be chosen for this assembly.

Figure 2:
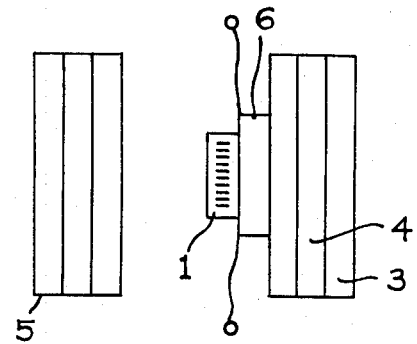
FIG. 2 shows in more detail a part of FIG. 1.

As shown in FIG. 2, solar cell 1 will be preferably coupled to the radiator or water bar 3 by means of a heat-conducting support 6.

In FIG. 1, the light concentrated on cell 1 has been shown. It may be preferred to concentrate the light beam coming from reflector 2 at the level of the parasitic radiation absorption assembly 5, the light being defocused at the level of cell 1.

Cell 1 may in particular be of the vertical multijunction silicon cell type, such as described particularly in the article by B. L. Sater et al published in the work entitled "Solar Cells", edited by C. E. Backus, I.E.E.E. Press (1976), pages 311 to 316.

The present invention is not limited to the embodiments which have been explicitly described above; it includes the different variations and generalizations thereof included in the scope of the following claims.

What is claimed is:

1. A process for cooling a photovoltaic cell having an integral fluid-circulation radiator, consisting in disposing, in front of the cell and in the path of the incident radiation, an assembly through which the cooling fluid flows and which absorbs at least a part of the incident radiation whose spectrum is outside the sensitivity zone of the cell.

2. The process as claimed in claim 1, wherein said assembly comprises transparent windows between which the fluid flows and wherein the materials forming the windows and the fluid are chosen so that at least a part of the radiation absorbed is absorbed directly by the fluid.

3. In a combined photothermic and photovoltaic concentrated-light solar device comprising a photovoltaic cell having an integral radiator in which there flows a cooling fluid, there is further provided:

an assembly disposed in the path of the incident beam, means for causing the fluid leaving the radiator to flow in said assembly, said assembly absorbing, in cooperation with the fluid, at least a part of the incident radiation situated outside the spectral response band of the photovoltaic cell and transmitting the heat collected to the cooling fluid.

4. The device as claimed in claim 3, wherein said assembly comprises transparent windows between which the cooling fluid flows.

5. The device as claimed in claim 4, wherein the cooling fluid is water.

6. The device as claimed in claim 4, wherein said windows are made from quartz.

7. The device as claimed in claim 4, wherein the incident light is focused on said assembly and is slightly defocused at the level of the photovoltaic cell.

8. The device as claimed in claim 3 wherein the photovoltaic cell is of the vertical multijunction silicon cell type.

9. The device as claimed in claim 8, wherein said assembly absorbs essentially the part of the incident radiation having wavelengths greater than 1.1 micron.

* * * * *